US007116097B2

(12) United States Patent
Revankar et al.

(10) Patent No.: US 7,116,097 B2
(45) Date of Patent: Oct. 3, 2006

(54) SYSTEM AND METHOD FOR DETECTING THE AXIAL POSITION OF A SHAFT OR A MEMBER ATTACHED THERETO

(75) Inventors: Gopal Subray Revankar, Moline, IL (US); Keith Wayland Gray, Denver, IA (US); Dale H. Killen, Port Byron, IL (US)

(73) Assignee: Deere & Company, Moline, IL (US)

(*) Notice: Subject to any disclaimer, the term of this patent is extended or adjusted under 35 U.S.C. 154(b) by 0 days.

(21) Appl. No.: 10/974,330

(22) Filed: Oct. 27, 2004

(65) Prior Publication Data

US 2006/0087313 A1 Apr. 27, 2006

(51) Int. Cl.
*G01B 7/14* (2006.01)
*G01R 33/12* (2006.01)
*G01N 27/72* (2006.01)

(52) U.S. Cl. ................................ 324/207.13; 324/228

(58) Field of Classification Search ........... 324/207.13, 324/228

See application file for complete search history.

(56) References Cited

U.S. PATENT DOCUMENTS

| | | | | |
|---|---|---|---|---|
| 3,956,973 | A * | 5/1976 | Pomplas | 92/5 R |
| 5,617,024 | A | 4/1997 | Simpson et al. | 324/209 |
| 5,698,977 | A | 12/1997 | Simpson et al. | 324/209 |
| 5,847,562 | A | 12/1998 | Fulton et al. | 324/229 |
| 5,859,531 | A * | 1/1999 | Maurice et al. | 324/207.13 |
| 5,942,894 | A | 8/1999 | Wincheski et al. | 324/220 |
| 6,147,342 | A | 11/2000 | Kucher | 250/231.13 |
| 6,253,460 | B1 * | 7/2001 | Schmitz | 33/706 |
| 6,393,963 | B1 | 5/2002 | Kadlicko | 92/5 |
| 6,714,004 | B1 * | 3/2004 | Jagiella | 324/207.16 |
| 6,834,574 | B1 | 12/2004 | Neumann | 91/1 |
| 6,989,669 | B1 | 1/2006 | Low et al. | 324/207.25 |

FOREIGN PATENT DOCUMENTS

| | | |
|---|---|---|
| DE | 100 20 764 | 1/2001 |
| EP | 0 618 373 | 10/1994 |
| JP | 2038802 | 2/1990 |
| JP | 2138508 | 5/1990 |
| JP | 3152403 | 6/1991 |
| JP | 3265704 | 11/1991 |

* cited by examiner

*Primary Examiner*—Reena Aurora

(57) ABSTRACT

In accordance with one embodiment of the invention, a method and system for detecting the position of a shaft comprises providing a shaft with defined hardened metallic regions. The shaft has a first hardened metallic region from a surface of the shaft to a first radial depth from the surface at a first longitudinal position. The shaft has a second hardened metallic region from the surface of the shaft to a second radial depth at a second longitudinal position. The second radial depth is different from the first radial depth. A sensor senses an eddy current to detect an alignment of at least one of the first hardened metallic region and the second hardened metallic region with a fixed sensing region at a respective time. A data processor determines a longitudinal position of the shaft with respect to a cylinder at the respective time based on the sensed eddy current.

20 Claims, 4 Drawing Sheets

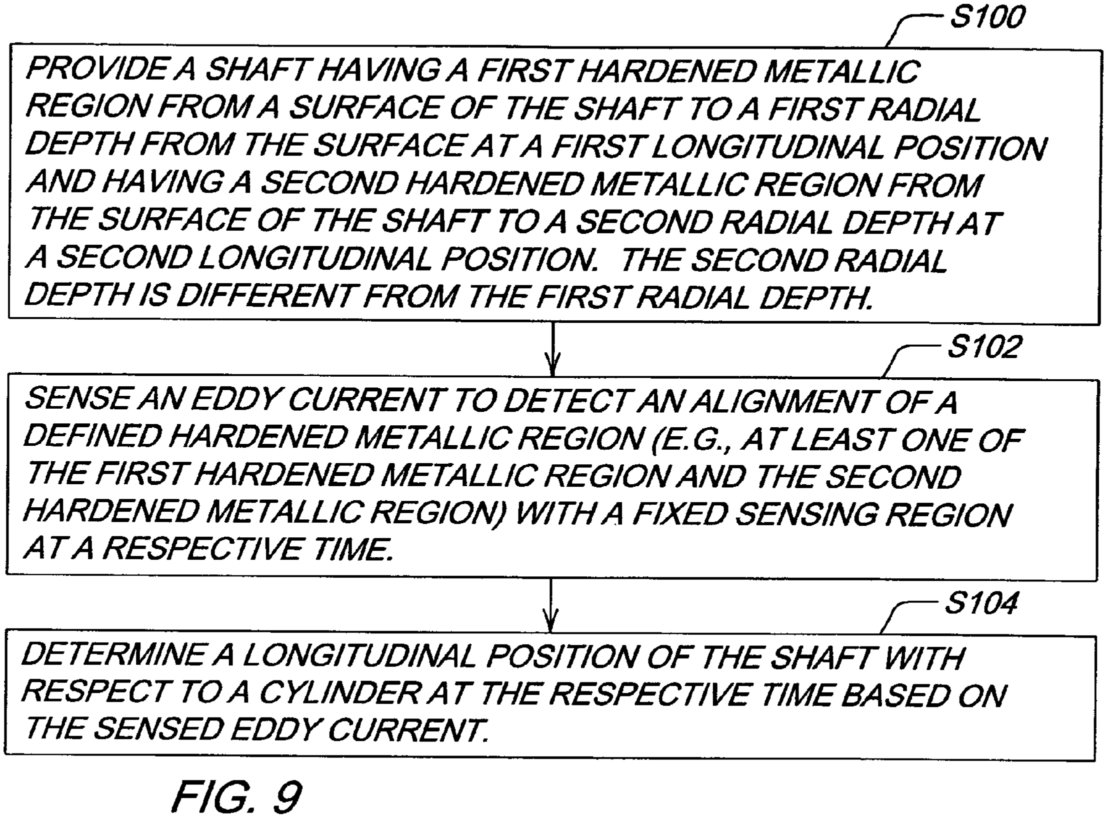
FIG. 9
FIG. 10
$1/x^2$ Hardened Depth Profile
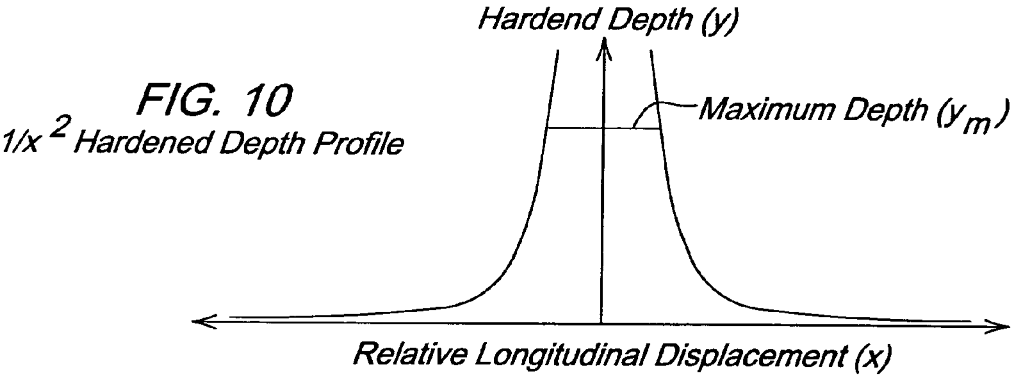
FIG. 11
$1\sqrt{x}$ Hardened Depth Profile
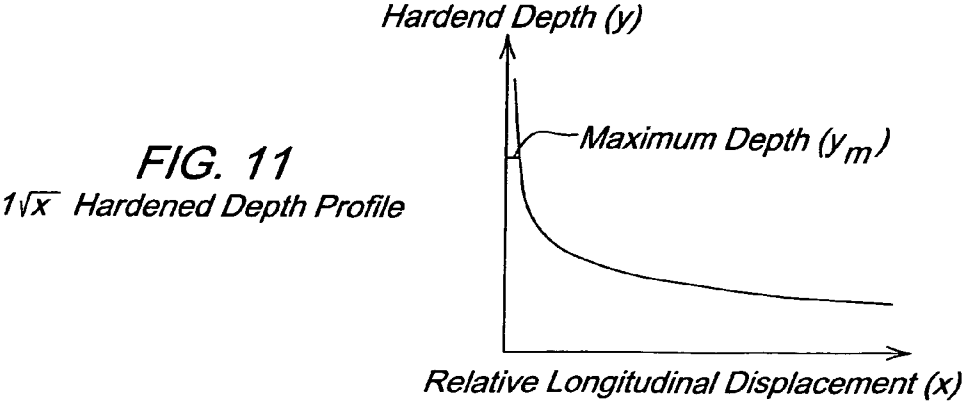

SYSTEM AND METHOD FOR DETECTING THE AXIAL POSITION OF A SHAFT OR A MEMBER ATTACHED THERETO

FIELD OF THE INVENTION

This invention relates to a method and system for detecting the axial position of a shaft or a member attached thereto.

BACKGROUND OF THE INVENTION

In the prior art, cylinder position sensing devices may use a magnet embedded in a piston and one or more Hall effect sensors that sense the magnetic field; hence, relative displacement of the piston. However, in practice such cylinder position sensors are restricted to cylinders with limited stroke and may require expensive magnets with strong magnetic properties. Other prior art cylinder position sensing devices may use magnetostrictive sensors which require multiple magnets to be mounted in the cylinder. To the extent that machining and other labor is required to prepare for mounting of the magnets, the prior art cylinder position sensing may be too costly and impractical for incorporation into certain shafts. Thus, a need exists for a reliable and economic technique for determining the position of a piston or other member.

SUMMARY OF THE INVENTION

In accordance with one embodiment of the invention, a method and system for detecting the axial position of a shaft comprises providing a shaft with defined hardened metallic regions. The shaft has a first hardened metallic region from a surface of the shaft to a first radial depth from the surface at a first longitudinal position. The shaft has a second hardened metallic region from the surface of the shaft to a second radial depth at a second longitudinal position. The second radial depth is different from the first radial depth. A sensor senses an eddy current or electromagnetic field to detect an alignment of a particular region (e.g., at least one of the first hardened metallic region and the second hardened metallic region) of the defined hardened metallic region with a fixed sensing region at a respective time. A data processor determines a longitudinal position of the shaft with respect to a cylinder at the respective time based on the sensed eddy current or electromagnetic field.

BRIEF DESCRIPTION OF THE DRAWINGS

FIG. 9 is a flow chart of a method for detecting the axial position of the shaft (or a member attached thereto) in accordance with the invention.

FIG. 10 is a graph of hardened depth versus relative longitudinal displacement along an alternate embodiment of a shaft in accordance with the invention.

FIG. 11 is a graph of hardened depth versus relative longitudinal displacement along another alternate embodiment of a shaft in accordance with the invention.

Like reference numbers in different drawings indicate like elements.

DESCRIPTION OF THE PREFERRED EMBODIMENT

Figure 1:
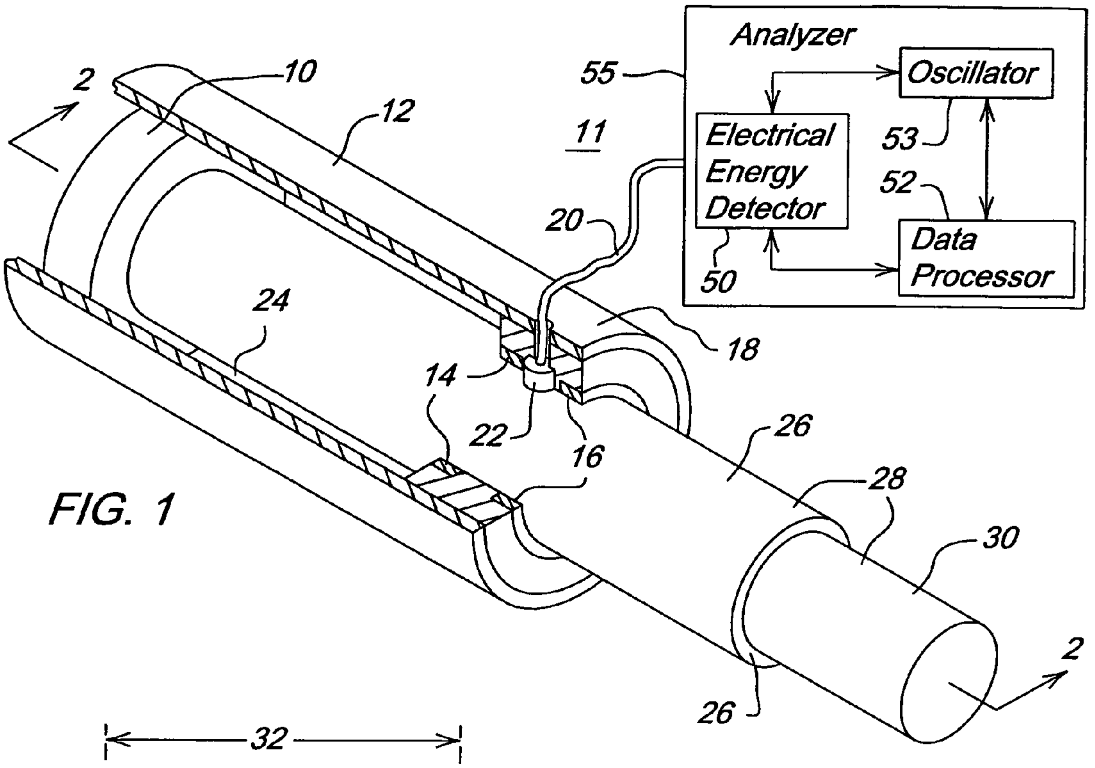
FIG. 1 is a perspective view of a system for detecting the axial position of a shaft (or a member attached thereto) in accordance with the invention.

In accordance with one embodiment, FIG. 1 shows a perspective view of a system for detecting an axial position of a shaft 28 (or a member 10 attached thereto) with respect to a cylinder 12 (e.g., hydraulic cylinder). The cylinder 12 is cut away to better reveal the components of FIG. 1. A member 10, such as a piston, may be coupled to one end of the shaft 28. The member 10 is slidable in an axial direction within the cylinder 12. The volume bounded by the member 10 and the interior of the cylinder 12 is referred to as the chamber 24. If the member 10 and shaft 28 are part of a hydraulic cylinder or assembly, the chamber 24 would contain hydraulic fluid or oil, for example.

A bushing 18 is associated with the cylinder 12. For example, a bushing 18 is secured (e.g., press-fitted or threaded into the interior of the cylinder 12) between the cylinder 12 and the shaft 28. The bushing 18 houses one or more seals (e.g., inner seal 14 and outer seal 16) and a sensor 22. The bushing 18 or the cylinder 12 supports the mounting of an inner seal 14 and an outer seal 16. In one embodiment, the seals are be lubricated to reduce friction at the shaft-bushing interface. The bushing 18 may function as a shaft guide for the shaft 28. The bushing 18 supports longitudinal movement of the shaft 28 with respect to the cylinder 12.

Although a sensor 22 may be housed in the bushing 18 as shown in FIG. 1, in other embodiments the sensor 22 may be mounted elsewhere on the cylinder 12. For example, in an alternate embodiment the sensor 22 may comprise a ring with an central opening located around the shaft 28. In yet another alternate embodiment, the sensor 22 is integrated into the inner seal 14 or outer seal 16.

The sensor 22 facilitates sensing of the axial position of the shaft 28 with respect to the cylinder 12. The sensor 22 may comprise a coil, an inductive probe or the like that is fed with an alternating current signal or radio frequency signal from an oscillator 53 within the analyzer 53.

The analyzer 55 is electrically or electromagnetically coupled to the sensor 22. The analyzer 55 comprises an oscillator 53 for generating an alternating current signal (e.g., radio frequency signal), an electrical energy detector 50 for detecting changes in the electromagnetic field or eddy current field induced by the generated signal about the sensor 22, and a data processor 52 for correlating the changes in the eddy current field to a change in an axial shaft position of the shaft 28. The oscillator 53 may generate one or more a signals within a spectral range (e.g., 10 Hz to 10

KHz) to energize the sensor 22 and to cause the radiation of an eddy current field or electromagnetic radiation.

In one embodiment, the electrical energy detector 50 comprises a voltage meter or voltage measuring device that is coupled in parallel with an inductor or coil of the sensor 22. In another embodiment, the electrical energy detector 50 comprises a current meter or current measuring device that is coupled in series with the sensor 22. The electrical energy detector 50 may be associated with an analog-to-digital converter, if the sensor 22 would otherwise provide an analog output to the data processor 52.

The data processor 52 determines axial or longitudinal position of the shaft 28 with respect to a cylinder 12 at the respective time based on the sensed eddy current or sensed electromagnetic field detected by the electrical energy detector 50. Advantageously, the sensor 22 is not located with the pressurized chamber of the cylinder 12 and does not need to withstand any thermal stress or pressure associated with the chamber 24.

The thickness and shape of the defined hardened region of the shaft (e.g., shaft 28) may be varied along a length of the shaft in accordance with various embodiments of the shaft. An induction hardening procedure or other case hardening procedure may be used to vary the defined hardened region of the shaft, for example. Hardening refers to any process (e.g., induction hardening) which increases the hardness of a metal or alloy. For example, a metal or alloy is heated to a target temperature or target temperature range and cooled at a particular rate or over a particular cooling time. Case hardening refers to adding carbon to a surface of an iron alloy to produce a carburized alloy and heat-treating (e.g., induction heating) all or part of a surface of the carburized iron alloy. The hardening process may be used to change the permeability of the carburized iron alloy, metal or alloy, while leaving the electrical conductivity generally unchanged, for instance.

Induction hardening may be used to define the defined hardened region by controlling a depth of hardening through varying the induction current. In one example, the induction frequency may be varied linearly as the induction coil travels axially along the length of the shaft to produce a non-linear depth of hardened case along the length of the shaft. In the another example, the induction frequency may be varied to produce a linear variation of hardened case depth along the length of the shaft. The following variables may influence induction hardening of the shaft (e.g., shaft 28): (1) power density induced in a surface layer of the shaft, (2) clearance between the induction coil and the shaft, (3) concentricity or coaxial alignment between the induction coil and the shaft, (4) coil voltage, (5) coil design, (6) speed of coil travel with respect to the surface of the shaft, and (7) ambient conditions including room temperature, humidity and air turbulence.

The thickness (i.e., depth) and shape of the defined hardened region may cause permeability variations (from a surface to radial depth therefrom) or other material variations that affect eddy current propagation along the length of the shaft that are measurable by the analyzer 55. In one embodiment as illustrated by FIG. 1 in conjunction with FIG. 2 and FIG. 8, the shaft 28 has a first hardened metallic region 36 from a surface of the shaft 28 to a first radial depth 80 from the surface at a first longitudinal position 40. The shaft 28 has a second hardened metallic region 34 from the surface of the shaft 28 to a second radial depth 82 at a second longitudinal position 39 or a third longitudinal position 38. The second radial depth 82 is different from the first radial depth 80. An intermediate metallic region 51 between the first hardened metallic region 36 and the second hardened metallic region 34 varies in a generally linear manner as shown in the cross section of FIG. 2, for example. Although the intermediate metallic region 51 is sloped radially outward with an axial displacement from either end of the shaft toward a first longitudinal position 40 of the shaft 28, in other embodiments the intermediate metallic region 51 may be sloped radially inward with an axial displacement from either end of the shaft toward the first longitudinal position 40 of the shaft 28.

The sensor 22 senses an eddy current or an electromagnetic field to detect an alignment of a portion of the defined metallic region with a fixed sensing region at a particular time. For example, the sensor 22 senses a first eddy current or first electromagnetic field when the shaft 28 has a first longitudinal position 40 aligned with the first hardened metallic region 36; the sensor 22 senses a second eddy current or second electromagnetic field when the shaft 28 has a second longitudinal position 39 aligned with the second hardened metallic region 34. The change in eddy current (or electromagnetic field) between the first eddy current and the second eddy current indicates the movement or change in position of the shaft 28. The electrical energy detector 50 measures the change in the eddy current or electromagnetic field associated with the axial displacement of the shaft 28 by monitoring the current or voltage induced in the sensor 22. The data processor 52 may store a reference table or database of axial positions of the shaft 28 versus measured current values. The sensed current value is compared to the reference current value to determine the axial position of the shaft 28.

If the depth of the defined hardened region varies symmetrically about a central region of the shaft 28 as generally shown in FIG. 1, a potential ambiguity exists for each equivalent thickness of the hardened region along the shaft 28. To distinguish the equivalent regions, various techniques may be applied alternatively or cumulatively. Under a first technique, the a first slope of a defined hardened region from a central region (e.g., first longitudinal position 40) of the shaft 28 to one end (e.g., the second longitudinal position 39) may be different (e.g., steeper) than a second slope of the defined hardened region from the central region of the shaft 28 to the opposite end (e.g., the third longitudinal position 38). Under a second technique, a supplemental sensor may determine the direction of axial travel of the shaft 28 to resolve the ambiguity between each equivalent thickness of the hardened region along the shaft 28. Under a third technique, a supplemental sensor may be used when the shaft 28 reaches travel limit in one axial direction or when the shaft 28 reaches another travel limit in an opposite axial direction. For example, a contact sensor may be associated with the end of the bushing 18 to contact the member 10 (e.g., piston) at its travel limit and provide an electrical signal consistent with such contact. Under a fourth technique, only half the axial displacement is sensed from the first longitudinal position 40 to the second longitudinal position 39 or from the first longitudinal position to the third longitudinal position 38.

The profile or cross section of the defined hardened region or the intermediate metallic region 51 between the first hardened metallic region 36 and the second hardened metallic region 34 may vary in accordance with various alternative embodiments of the shaft 28. Under a first embodiment of the shaft 28, the intermediate region 51 between the first hardened metallic region 36 and the second hardened metallic region 34 are linearly sloped consistent with FIG. 1, FIG. 2., and FIG. 8. Under a second embodiment of a shaft 28, an intermediate metallic region 51 between the first hardened metallic region 36 and the second metallic region varies in accordance with $1/x^2$, where x is a longitudinal distance traversed along the shaft 28. The second embodiment is consistent with the hardened depth profile of FIG. 10. Under a third embodiment of a shaft 28, an intermediate metallic region 51 between the first hardened metallic region 36 and the second hardened metallic region 34 varies in accordance with $1/\sqrt{f}$, where f is the frequency of the induction current used to harden the intermediate metallic region 51. The third embodiment of the shaft is consistent with the hardened depth profile of FIG. 11. Under a fourth embodiment, if the defined hardened region is not substantially symmetrical within a cross section of the shaft 28, the shaft 28 may be mechanically restricted from rotational movement to prevent rotation relative to the cylinder 12. Under a fifth embodiment of a shaft 28, the first hardened metallic region 36 and the second hardened metallic region 34 are formed in accordance with the following equation:

$y=\sqrt{\rho}/\pi\mu_o\mu f$, where ρ is the resistivity of the shaft 28, $\mu_o$ is the magnetic permeability of the vacuum, μ is the relative permeability of the shaft 28, and f is the frequency of the induction current. Under a sixth embodiment of the shaft 28, the first hardened metallic region 36 and the second hardened metallic region 34 are formed in accordance with the following equation:

$y=k\sqrt{f}$, where k is a constant based on a metallic material at a given temperature range and f is the frequency of the induction current. Any of the foregoing alternate embodiments of the shaft 28 may be applied to the configuration of FIG. 1 and FIG. 2, for example. Further, some of the foregoing alternate embodiments are described in greater detail in conjunction with FIG. 10 through FIG. 11.

Although the shaft 28 may be constructed of various metals or alloys that fall within the scope of the invention, in one embodiment the shaft represents a steel or iron-based alloy, which may be plated with a protective metallic plating material (e.g., nickel and chromium). The metallic plating material is not shown in FIG. 1. If the metallic plating material is applied to an exterior surface of the shaft 28, the thickness of the plating should be kept substantially uniform to prevent disturbances in the eddy current or electromagnetic field induced by the sensor 22.

Figure 2:
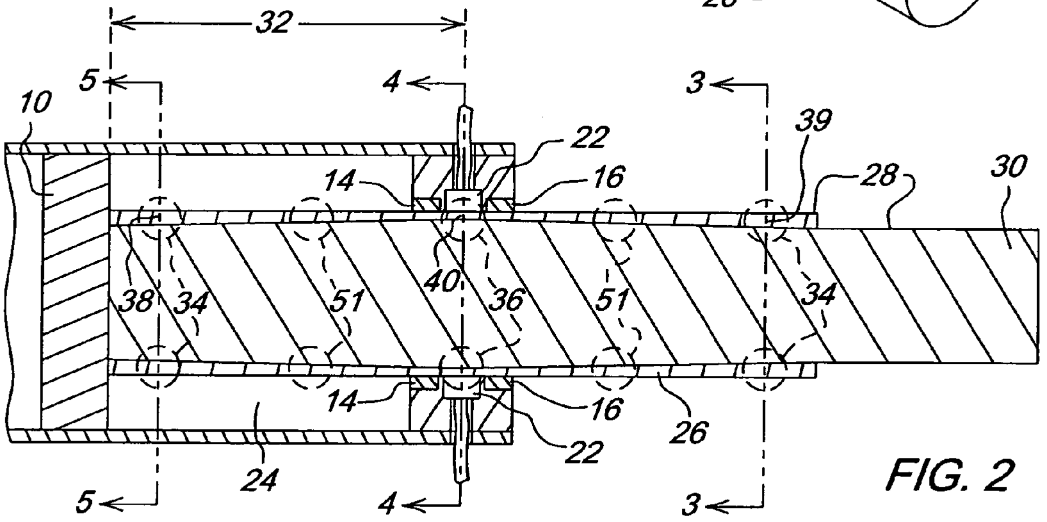
FIG. 2 is a cross-sectional view of the system of FIG. 1.

FIG. 2 shows an intermediate axial position 32 or displacement of the shaft 28 between two opposite travel limits. In FIG. 2, a first hardened metallic region 36 is aligned with the sensing region associated with the sensor 22. The first hardened metallic region 36 is associated with a first longitudinal position 40 of the shaft 28. The second hardened metallic regions 34 lie on either side of the first hardened metallic region 36. Like reference numbers in FIG. 2 and FIG. 1 indicate like elements.

Figure 3:
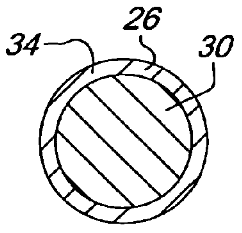
FIG. 3 is a cross-sectional view of the shaft along reference line 3—3 of FIG. 2.

FIG. 3 shows a cross section of the shaft 28 along reference line 3—3 at the second longitudinal position 39 of the shaft 28. The second longitudinal position 39 is coextensive with the second hardened metallic region 34 of the shaft 28. The second hardened metallic region 34 overlies the shaft core 30.

Figure 4:
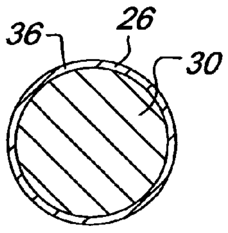
FIG. 4 is a cross-sectional view of the shaft along reference line 4—4 of FIG. 2.

FIG. 4 shows a cross section of the shaft 28 along reference line 4—4 at the first longitudinal position 40 of the shaft 28. The first longitudinal position 40 is coextensive with the first hardened metallic region 36 of the shaft 28. The first hardened metallic region 36 overlies the shaft core 30.

Figure 5:
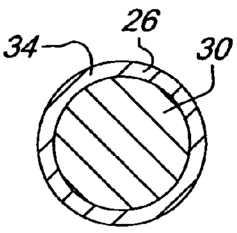
FIG. 5 is a cross-sectional view of the shaft along reference line 5—5 of FIG. 2.

FIG. 5 shows a cross section of the shaft 28 along reference line 5—5 at the third longitudinal position 38 of the shaft 28. The third longitudinal position 38 is coextensive with the second hardened metallic region 34 of the shaft 28. The second hardened metallic region 34 overlies the shaft core 30. The second hardened metallic region 34 associated with the third longitudinal position 38 is located at an opposite end of the shaft 28 with respect to the second hardened metallic region 34 associated with the second longitudinal position 39.

Figure 6:
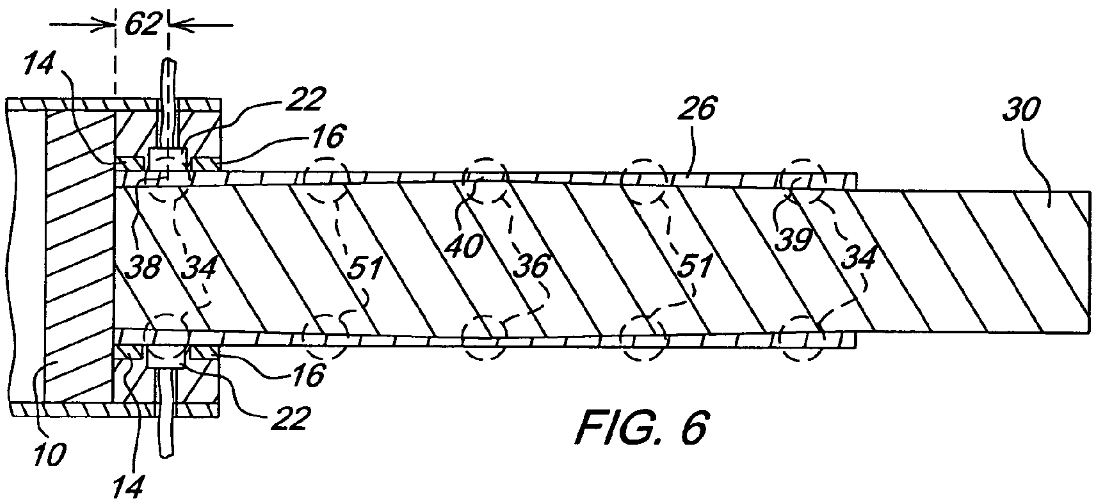
FIG. 6 is a cross-sectional view of the shaft in a position of minimum axial displacement.

FIG. 6 shows a minimum axial position 62 or displacement of the shaft 28 at a corresponding travel limit. In FIG. 6, the third longitudinal position 38 (which is coextensive with or lies within a second hardened metallic region 34) is aligned with the sensing region associated with the sensor 22. Like reference numbers in FIG. 1 and FIG. 6 indicate like elements.

Figure 7:
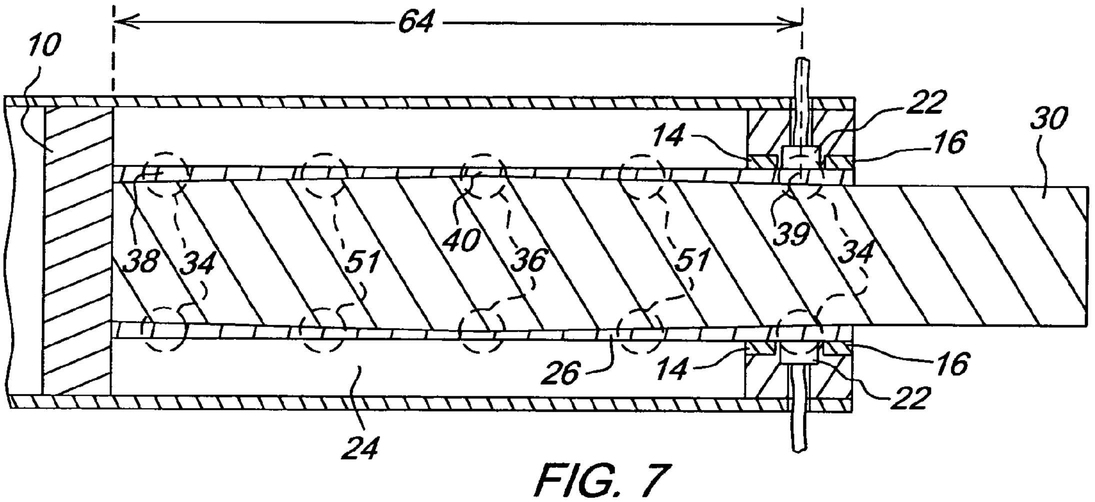
FIG. 7 is a cross-sectional view of the shaft in a position of maximum axial displacement.

FIG. 7 shows a maximum axial position 64 or displacement of the shaft 28 at a corresponding travel limit. In FIG. 7, second longitudinal position 39 of the shaft 28, which is coextensive with or lies within a second hardened metallic region 34, is aligned with the sensing region associated with the sensor 22. Like reference numbers in FIG. 1 and FIG. 7 indicate like elements.

Figure 8:
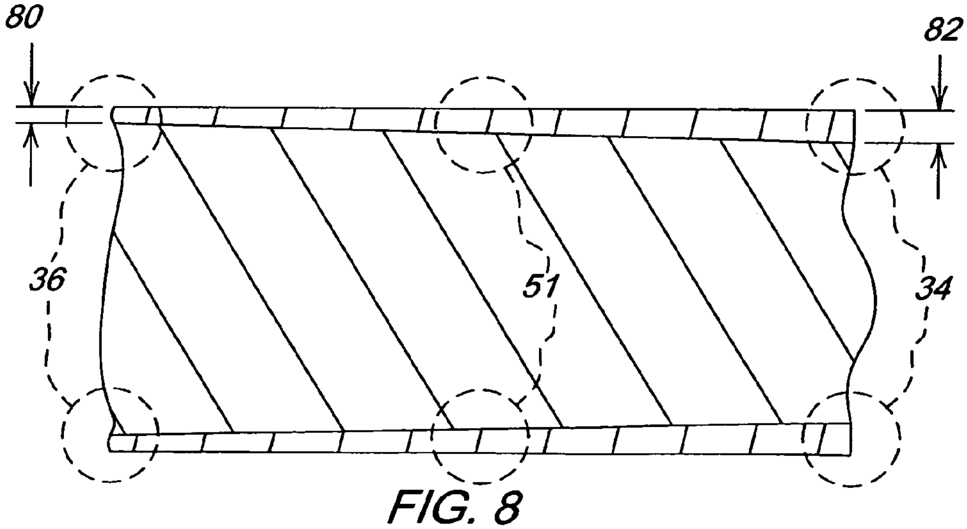
FIG. 8 is a cross-sectional view of a portion of the shaft of FIG. 1 and FIG. 2.

FIG. 8 shows a first radial depth 80 that is different from a second radial depth 82. The first radial depth 80 is associated with a first hardened metallic region 36. The second radial depth 82 is associated with a second hardened metallic region 34. Although an intermediate region 51 between the first hardened metallic region 36 and the second hardened metallic region 34 varies in a generally linear manner as shown in FIG. 8, the intermediate region 51 may vary in accordance with other profiles (e.g., varied by induction frequency of induction hardening), some of which were discussed in conjunction with FIG. 1. In practice, the actual case depth or defined hardened metallic region may differ somewhat from a theoretical, linear variation along the length of the shaft 28.

FIG. 9 is a method for detecting the position of a hydraulic member 10. The method of FIG. 9 begins in step S100.

In step S100, a shaft 28 is provided having a first hardened metallic region 36 from a surface of the shaft 28 to a first radial depth 80 from the surface at a first longitudinal position 40 and having a second hardened metallic region 34 from the surface of the shaft 28 to a second radial depth 82 at a second longitudinal position 39. The second radial depth 82 is different from the first radial depth 80. For example, as shown in FIG. 8, the first radial depth 80 is greater than the second radial depth 82 in significant manner (e.g., a material variation in permeability between the first radial depth 80 and the second radial depth 82) that may be sensed by sensor 22.

In step S102, a sensor 22 senses an eddy current to detect an alignment of a defined hardened metallic region 26 with a fixed sensing region at a particular time. For example, the sensor 22 senses an eddy current or electromagnetic field indicative of the alignment of at least one of the first hardened metallic region 36, the second hardened metallic region 34, and the intermediate metallic region 51 with a fixed sensing region at a respective time.

In step S104, the data processor 52 determines an axial position or longitudinal position of the shaft 28 with respect to a cylinder 12 at the respective time based on the sensed eddy current or electromagnetic field. For example, the data processor 52 receives the sensed eddy current, converts the sensed eddy current into a digital signal or value, and the digital signal is compared to reference current values in a chart or database. The corresponding axial position of the shaft 28 corresponds to the referenced reference current value (which is closest to the sensed current value).

FIG. 10 illustrates a potential depth profile of the defined hardened metallic region 26 along a shaft 28. The relative longitudinal displacement or axial displacement along the shaft 28 is shown on the x axis. The hardened depth is shown on the y axis. A central region of the shaft 28 may have a maximum hardened depth, which is illustrated as $y_m$.

The depth profile of FIG. 10 is referred to as $1/x^2$ profile. The hardened depth profile of FIG. 10 is formed by applying an intermediate metallic region 51 between the first hardened metallic region 36 and the second hardened metallic region 34 that varies in accordance with $1/\sqrt{f}$, where f is the frequency of the induction current used to harden the intermediate metallic region 51. The defined hardened metallic region of FIG. 10 (e.g., the first hardened metallic region 36, the intermediate metallic region 51, and the second hardened metallic region 34) are formed in accordance with the following equation:

$y=\sqrt{\rho/\pi\mu_o\mu f}$, where ρ is the resistivity of the shaft, $\mu_o$ is the magnetic permeability of the vacuum, μ is the relative permeability of the shaft, and f is the frequency of the induction current.

FIG. 11 illustrates a potential depth profile of the defined hardened metallic region 26 along a shaft 28. The relative longitudinal displacement or axial displacement along the shaft 28 is shown on the x axis. The hardened depth is shown on the y axis. One end of the shaft 28 may have a maximum hardened depth, which is illustrated as $y_m$.

The depth profile of FIG. 11 is referred to as $1/\sqrt{x}$ profile. In FIG. 11, the an intermediate metallic region 51 between the first hardened metallic region 36 and the second hardened metallic region 34 varies in accordance with $1/\sqrt{f}$, where f is the frequency of the induction current used to harden the intermediate metallic region 51. The defined hardened metallic region of FIG. 11 (e.g., the first hardened metallic region and the second hardened metallic region) are formed in accordance with the following equation:

$y=\sqrt{\rho/\pi\mu_o\mu f}$, where ρ is the resistivity of the shaft, $\mu_o$ is the magnetic permeability of the vacuum, μ is the relative permeability of the shaft, and f is the frequency of the induction current.

Figure 12:
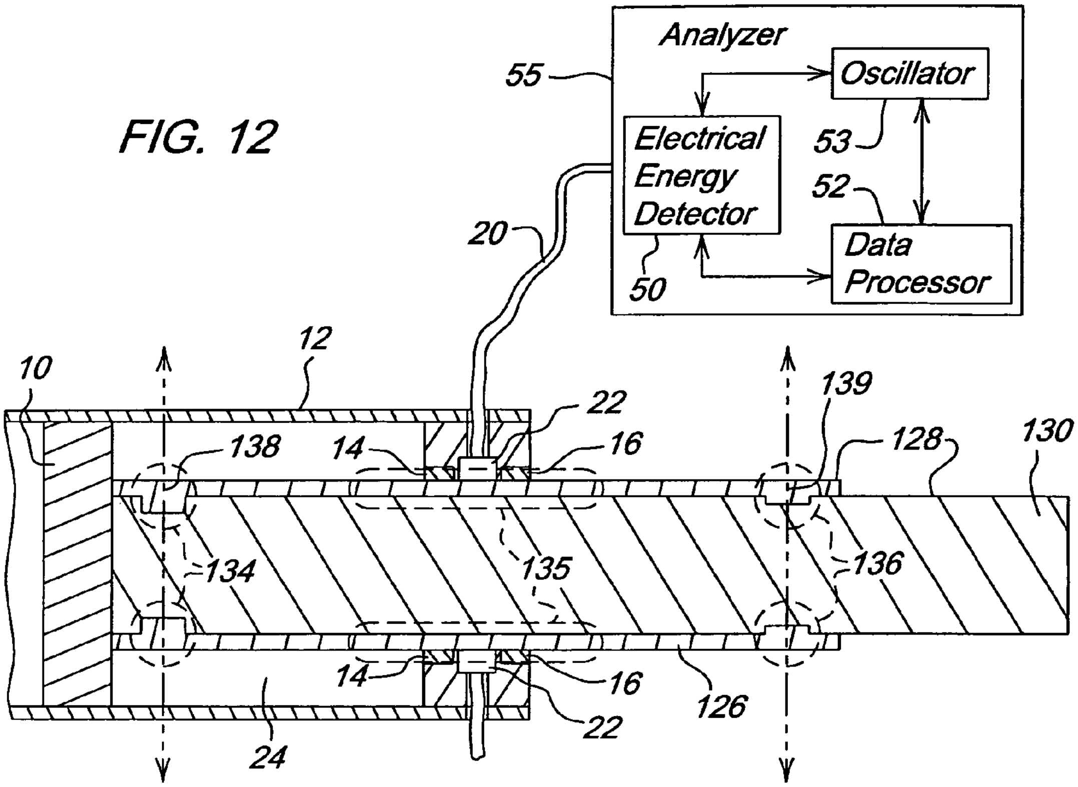
FIG. 12 is a cross-sectional view of an alternate embodiment of a system for detecting the axial position of a shaft (or a member attached thereto).

The shaft 128 of FIG. 12 is similar to the shaft 28 of FIG. 2, except the defined hardened metallic region of FIG. 12 comprises a first hardened metallic region 134, a second hardened metallic region 136, and a intermediate hardened metallic region 135. Like reference numbers in FIG. 1, FIG. 2, and FIG. 12 indicate like elements.

FIG. 12 is consistent with two alternative embodiments. Under a first embodiment of FIG. 12, first hardened metallic region 134 comprises a generally rectangular strip with a first radial depth; the second hardened metallic region 136 is spaced apart from the first hardened metallic region 134 and has a second radial depth that is different from the first radial depth. Different radial depths means the first radial depth may be radially greater or less than the second radial depth. Independent of the radial depths of the rectangular strips, each rectangular strip on a shaft may be axially longer or shorter than the other rectangular strip. The intermediate hardened metallic region 135 lies between the first hardened metallic region 134 and the second hardened metallic region 136. As shown in FIG. 12, the intermediate hardened metallic region 135 is thinner than the first hardened metallic region 134; the intermediate hardened metallic region 135 is thinner than the second metallic region 136.

Under a second embodiment of a shaft 128 of FIG. 12, the first hardened metallic region 134 is a generally annular region with a first radial depth; the second hardened metallic region 136 is a generally annular region spaced apart from the first hardened metallic region 134. The intermediate hardened metallic region 135 lies between the first hardened metallic region 134 and the second hardened metallic region 136. The second radial depth is different from (e.g., lesser or greater than) the first radial depth. Independent of the radial depths of the annular regions, each annular region on a shaft may be axially longer or shorter than the other rectangular strip If the first hardened metallic region 134 at a first longitudinal position 138 is aligned with the sensor 22, the shaft 128 has a first known axial displacement with respect to the cylinder 12. If the intermediate metallic region 135 is aligned with the sensor 22, the shaft has a second known axial displacement (e.g., an axial displacement range) with respect to the cylinder 12. If the second hardened metallic region 136 at a second longitudinal position 139 is aligned with the sensor 22, the shaft 128 has a third known axial displacement with respect to the cylinder 12. The configuration of FIG. 12 is useful for providing electronic stops for a member 10 traveling in a cylinder 12, for example.

Figure 13:
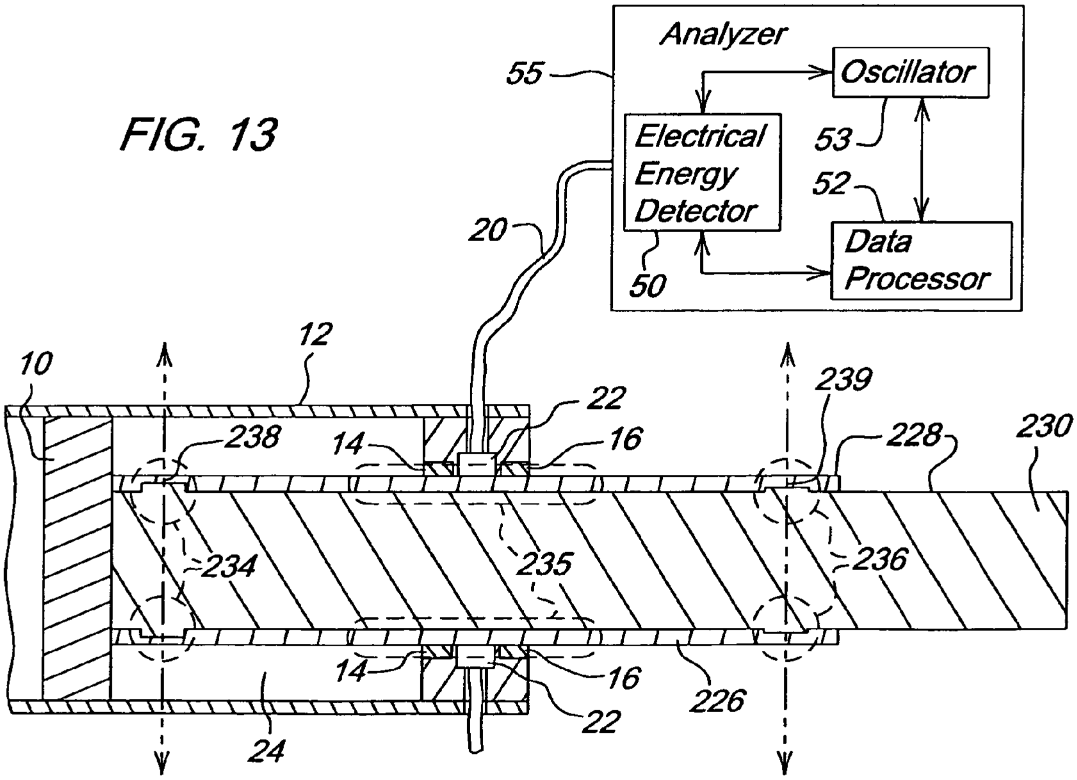
FIG. 13 is a cross-sectional view of yet another alternate embodiment of a system for detecting the axial position of a shaft (or a member attached thereto).

The shaft 228 of FIG. 13 is similar to the shaft 28 of FIG. 2, except the defined hardened metallic region of FIG. 13 comprises a first hardened metallic region 234, a second hardened metallic region 236, and a intermediate hardened metallic region 235. Like reference numbers in FIG. 1, FIG. 2, and FIG. 13 indicate like elements.

FIG. 13 is consistent with two alternative embodiments. Under a first embodiment of FIG. 13, first hardened metallic region 234 comprises a generally rectangular strip with a first radial depth; the second hardened metallic region 236 is spaced apart from the first hardened metallic region 234 and has a second radial depth that is different from the first radial depth. Different radial depths means the first radial depth may be radially greater or less than the second radial depth. Independent of the radial depths of the rectangular strips, each rectangular strip on a shaft may be axially longer or shorter than the other rectangular strip. The intermediate hardened metallic region 235 lies between the first hardened metallic region 234 and the second hardened metallic region 236. As shown in FIG. 13, the intermediate hardened metallic region 235 is thicker than the first hardened metallic region 234; the intermediate hardened metallic region 235 is thicker than the second metallic region 236.

Under a second embodiment of a shaft 228 of FIG. 13, the first hardened metallic region 234 is a generally annular region with a first radial depth; the second hardened metallic region 236 is a generally annular region spaced apart from the first hardened metallic region 234. The intermediate hardened metallic region 235 lies between the first hardened metallic region 234 and the second hardened metallic region 236. The second radial depth is different from (e.g., lesser or greater than) the first radial depth. Independent of the radial depths of the annular regions, each annular region on a shaft may be axially longer or shorter than the other rectangular strip If the first hardened metallic region 234 at a first longitudinal position 238 is aligned with the sensor 22, the shaft 228 has a first known axial displacement with respect to the cylinder 12. If the intermediate metallic region 235 is aligned with the sensor 22, the shaft has a second known axial displacement (e.g., an axial displacement range) with respect to the cylinder 12. If the second hardened metallic region 236 at a second longitudinal position 239 is aligned with the sensor 22, the shaft 228 has a third known axial displacement with respect to the cylinder 12. The configuration of FIG. 13 is useful for providing electronic stops for a member 10 traveling in a cylinder 12, for example.

All of the foregoing embodiments of the system of method of detecting a position of a shaft (or member attached thereto), use sensors that are mounted external to the cylinder chamber. Accordingly, no special sealing of the cylinder chamber is required. The detection system and method operates by sensing electromagnetic fields induced on the shaft surface and within a penetration depth; does not need to contact the shaft and requires no moving parts that might detract from reliability. The system and method may be readily used to retrofit existing cylinders in the field.

Having described the preferred embodiment(s), it will become apparent that various modifications can be made without departing from the scope of the invention as defined in the accompanying claims.

What is claimed is:

1. A method of detecting a position of a movable member associated with a cylinder, the method comprising:

providing a shaft having a core, a first hardened metallic region from a surface of the shaft to a first radial depth from the surface at a first longitudinal position, and a second hardened metallic region from the surface of the shaft to a second radial depth at a second longitudinal position; the second radial depth different from the first radial depth, the hardened metallic regions overlying the core and formed from at least one of case hardening and inductive hardening of a metal or an alloy of the shaft;

sensing an eddy current or induced electromagnetic field to detect an alignment of at least one of the first hardened metallic region and the second hardened metallic region with a fixed sensing region at a respective time; and determining a longitudinal position of the shaft with respect to a cylinder at the respective time based on the sensed eddy current.

2. The method according to claim 1 wherein an intermediate metallic region between the first hardened metallic region and the second hardened metallic region varies in a generally linear manner.

3. The method according to claim 1 wherein an intermediate metallic region between the first hardened metallic region and the second hardened metallic region varies in accordance with $1/\sqrt{f}$, where f is The frequency of the induction current used to harden the intermediate metallic region.

4. The method according to claim 1 wherein an intermediate metallic region between the first hardened metallic region and the second metallic region varies in accordance with $1/x^2$, where x is a longitudinal distance traversed along the shaft.

5. The method according to claim 1 wherein the first hardened metallic region is a generally rectangular strip with a first radial depth; the second hardened metallic region separated from the first metallic region and having a second radial depth that is different than the first radial depth.

6. The method according to claim 1 wherein the first hardened metallic region is a generally rectangular strip with a first axial length; the second hardened metallic region separated from the first metallic region and having a second axial length that is different than the first axial length.

7. The method according to claim 1 wherein the first hardened metallic region is a generally annular region with a first radial depth; the second hardened metallic region is a generally annular region spaced apart from the first hardened metallic region, the first metallic region and having a second radial depth that is different than the first radial depth.

8. The method according to claim 1 wherein the first hardened metallic region is a generally annular region with a first axial length; the second hardened metallic region is a generally annular region spaced apart from the first hardened metallic region, the first metallic region and having a second axial length that is lesser than the first axial length.

9. The method according to claim 1 further comprising:

forming the first hardened metallic region and the second hardened metallic region in accordance with the following equation:

$y=\sqrt{\rho}/\pi\mu_o\mu f$, where ρ is the resistivity of the shaft, $\mu_o$ is the magnetic permeability of vacuum, μ is the relative permeability of the shaft, and f is the frequency of the induction current.

10. The method according to claim 1 further comprising:

forming the first hardened metallic region and the second hardened metallic region in accordance with the following equation:

$y=k+\sqrt{f}$, where k is a constant based on a metallic material at a given temperature range and f is the frequency of the induction current.

11. A system of detecting a position of a movable member associated with a Cylinder, the system comprising:

a shaft having a core, a first hardened metallic region from a surface of the shaft to a first radial depth from the surface at a first longitudinal position, and a second hardened metallic region from the surface of the shaft to a second radial depth at a second longitudinal position, the second radial depth different from the first radial depth, the hardened metallic regions overlying the core and formed from at least one of case hardening and inductive hardening of a metal or an alloy of the shaft;

a sensor for sensing an eddy current or induced electromagnetic field to detect an alignment of at least one of the first hardened metallic region and the second hardened metallic region with reference to a fixed sensing region at a respective time; and a data processor for determining a longitudinal position of the shaft with respect to a cylinder at the respective time based on the sensed eddy current.

12. The system according to claim 11 wherein an intermediate metallic region between the first hardened metallic region and the second hardened metallic region varies in a generally linear manner.

13. The system according to claim 11 wherein an intermediate metallic region between the first hardened metallic region and the second hardened metallic region varies in accordance with $1/\sqrt{f}$, where f is the frequency of the induction current used to harden the intermediate metallic region.

14. The system according to claim 11 wherein an intermediate metallic region between the first hardened metallic region and the second metallic region varies in accordance with $1/x^2$, where x is a longitudinal distance traversed along the shaft.

15. The system according to claim 11 wherein the first hardened metallic region is a generally rectangular strip with a first radial depth; the second hardened metallic region adjacent to the first metallic region and having a second radial depth that is different than the first radial depth.

16. The system according to claim 11 wherein the first hardened metallic region is a generally rectangular strip with a first axial length; the second hardened metallic region separated from the first metallic region and having a second axial length that is different than the first axial length.

17. The system according to claim 11 wherein the first hardened metallic region is a generally annular region with a first radial depth; the second hardened metallic region is a generally annular region spaced apart from the first hardened metallic region, the first metallic region and having a second radial depth that is different than the first radial depth.

18. The method according to claim 11 wherein the first hardened metallic region is a generally annular region with a first axial length; the second hardened metallic region is a generally annular region spaced apart from the first hardened metallic region, the first metallic region and having a second axial length that is lesser than the first axial length.

19. The system according to claim 11 wherein the first hardened metallic region and the second hardened metallic region are formed in accordance with the following equation:

$y=\sqrt{\rho/\pi\mu_o\mu f}$, where ρ is the resistivity of the shaft, $\mu_o$ is the magnetic permeability of the vacuum, μ is the relative permeability of the shaft, and f is the frequency of the induction current.

20. The system according to claim 11 wherein the first hardened metallic region and the second hardened metallic region are formed in accordance with the following equation:

$y=k\sqrt{f}$, where k is a constant based on a metallic material at a given temperature range and f is the frequency of the induction current.

* * * * *